United States Patent [19]

Rimkeit et al.

[11] Patent Number: 4,785,475
[45] Date of Patent: Nov. 15, 1988

[54] APPARATUS AND METHOD FOR EQUALIZING A SOUNDFIELD

[76] Inventors: Eugene Rimkeit, 4438 SW. Hewett, Portland, Oreg. 97221; Richard Schomburg, Rte. 2, Box 444, Hillsboro, Oreg. 97123

[21] Appl. No.: 8,617

[22] Filed: Jan. 29, 1987

[51] Int. Cl.$^4$ .............................................. H03G 5/00
[52] U.S. Cl. ...................................... 381/98; 333/28 T
[58] Field of Search ....................... 381/98, 101, 103; 333/28 R, 28 T; 84/115, 345

[56] References Cited

U.S. PATENT DOCUMENTS

| | | | |
|---|---|---|---|
| 3,345,578 | 10/1967 | Shuda | 330/22 |
| 4,078,465 | 3/1978 | Wheelwright | 84/345 |
| 4,099,137 | 7/1978 | Alm, Jr. et al. | 331/16 |
| 4,106,384 | 8/1978 | Whittington et al. | 84/1.19 |
| 4,232,269 | 11/1980 | Willoner | 330/85 |
| 4,375,776 | 3/1983 | Okamoto | 84/345 |
| 4,388,851 | 6/1983 | Hoskinson et al. | 84/345 |
| 4,458,362 | 7/1984 | Berkovitz et al. | 381/103 |
| 4,483,231 | 11/1984 | Hirano | 84/345 |
| 4,512,230 | 4/1985 | Ezawa et al. | 84/345 |
| 4,513,254 | 4/1985 | Harr | 330/294 |
| 4,610,024 | 9/1986 | Schulhoff | 381/103 |

OTHER PUBLICATIONS

National Semiconductor, Application Note An-435, Mar. 1986.
Advertisement for DAX2800, by N.E.I., published Jun., 1985 (publication unspecified).
Lancaster, CMOS Cookbook, 1979, pp. 217-219.

*Primary Examiner*—Forester W. Isen
*Attorney, Agent, or Firm*—Dellett, Smith-Hill and Bedell

[57] ABSTRACT

Apparatus for equalizing a soundfield comprises an amplifier and a gain control circuit for selectively adjusting the gain of the amplifier as a function of frequency in response to data values received by the gain control circuit. The apparatus has power supply terminals for supplying operating current from an external power source to the amplifier and the gain control circuit. In addition, the apparatus comprises an electonic storage device for storing data values and applying those data values to the gain control circuit. The stored data values are maintained in the apparatus upon interruption of the supply of operating current to the power supply terminals. The apparatus has an input port for applying data values to the storage device, and does not have manually actuable controls for selectively adjusting the stored data values.

18 Claims, 5 Drawing Sheets

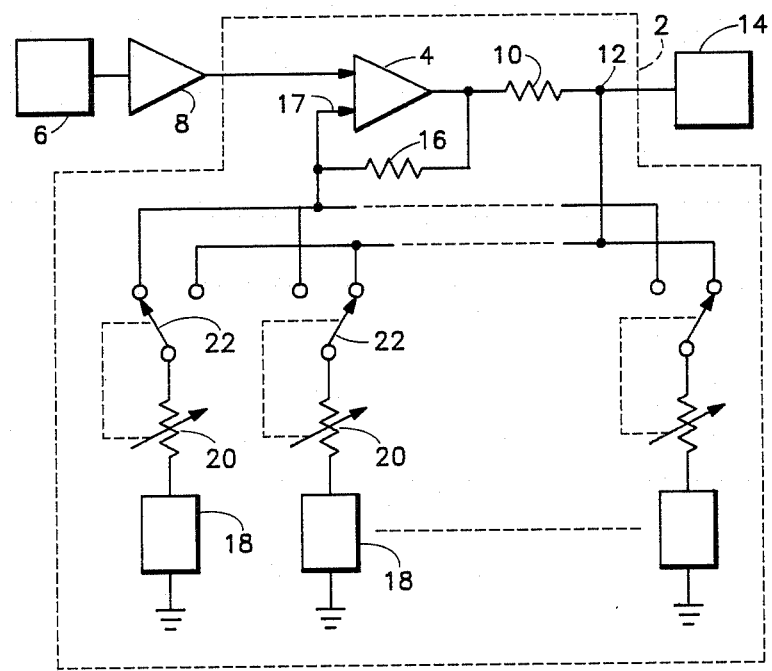
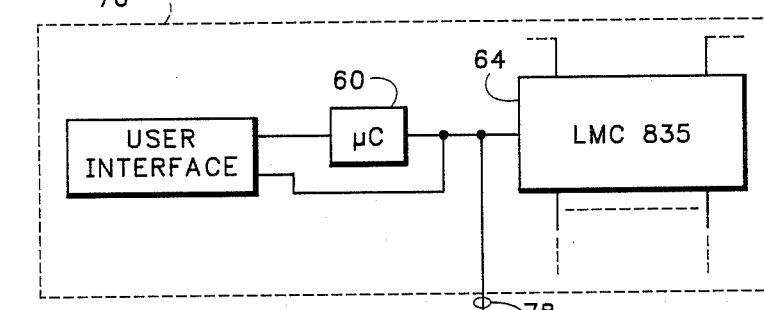
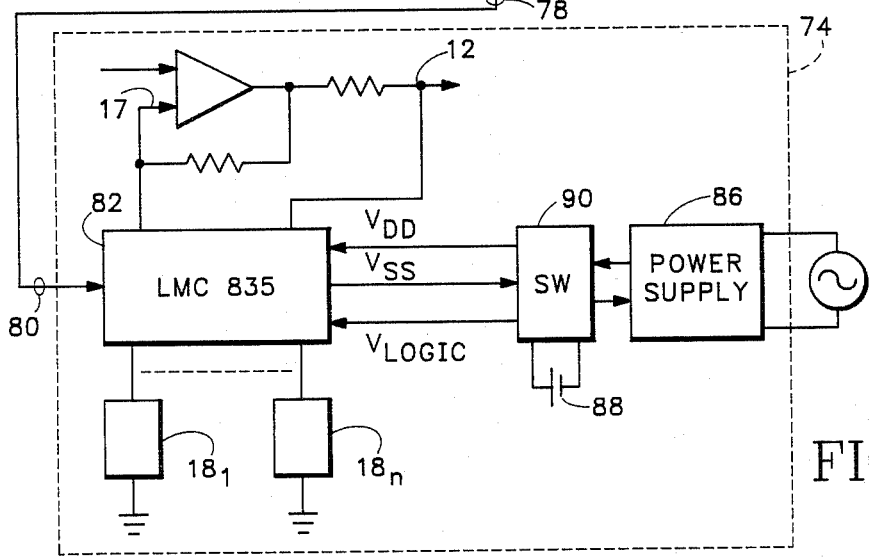
FIG. 1 PRIOR ART
FIG. 4

APPARATUS AND METHOD FOR EQUALIZING A SOUNDFIELD

This invention relates to an apparatus and method for equalizing a soundfield.

BACKGROUND OF THE INVENTION

As used herein, the term "soundfield" means an environment in which an audio frequency signal is propagated in electrical form from a signal source to an electroacoustic transducer and is propagated in acoustic form to a receiver. The source of the audio frequency electrical signal may be, for example, a microphone, the cartridge of a phonograph, the tuner of an FM or AM radio or the playback head of a tape player. The electroacoustic transducer may be a loudspeaker, and the receiver may be an acoustoelectric transducer or the human auditory system. Even when the receiver is an acoustoelectric transducer, for converting the audio frequency acoustic signal to electrical form, the signal will normally be applied eventually to the auditory system of a human listener. Thus, as used herein the term "soundfield" is not limited to an environment in which actors, singers or musicians generate vocal or musical sounds to be heard immediately by, or recorded for subsequent playback to, other persons, but applies also to, for example, an environment provided with a public address system, such as an airport terminal building, and a room having a sound amplification system, such as a courtroom.

The auditory sensation received by a person listening (either directly or indirectly) to the sound emitted by the electroacoustic transducer depends not only on the signal provided by the source of the audio frequency electrical signal but also on the frequency response of the signal propagation path from the signal source to the receiver. The frequency response of the propagation path defines the relationship between the amplitude of a signal component generated at the source and the amplitude of that same signal component provided at the receiver, as a function of the frequency of the signal component. If the frequency response of the propagation path is not uniform, the relative amplitudes of the signal components at different frequencies are altered during propagation from the signal source to the receiver.

Generally, the frequency response of a signal propagation path is not uniform, and it is conventional to compensate for the non-uniformity in the frequency response of the propagation path from the signal source to the receiver by including an equalizer in the propagation path. An equalizer is an amplifier of which the frequency response is selectively variable. In general, if, in the absence of the equalizer, a signal component at a given frequency is attenuated in the propagation path to a greater degree than are signal components at other frequencies, the frequency response of the equalizer is adjusted so that the gain of the amplifier is greater at the given frequency than at other frequencies.

As shown in FIG. 1, a known form of an equalizer 2 comprises an operational amplifier 4 having a non-inverting input terminal which receives the signal from a signal source 6 by way of an audio amplifier 8. The amplifier 4 has an output terminal which is connected through a resistor 10 to an output node 12 which is in turn connected to a loudspeaker 14. A feedback resistor 16 is connected between the output terminal of the amplifier 4 and its inverting input terminal 17. The equalizer also comprises a bank of n resonators $18i$ ($i=1 \ldots n$) of predetermined Q and selected center frequencies $f_i$. A variable resistor $20i$ is connected between each resonator and an associated switch $22i$. In a first position of the switch $22i$ the series combination of the resistor $20i$ and the resonator $18i$ is connected between the terminal 17 and ground, and in a second position of the switch $22i$ the series combination is connected between the node 12 and ground. Ignoring the effect of the other resonators and resistors, when the switch $22_1$ associated with the resonator $18_1$ having the center frequency $f_1$ is in the first position, the gain $A_{v1}$ at the frequency $f_1$ is given by $$A_{v1} = 1 + \frac{R16_1}{R20_1 + Z_1}$$

where R16 is the resistance of the resistor $16_1$, $R20_1$ is the resistance of the variable resistor $20_1$ and $Z_1$ is the impedance of the resonator $18_1$ at the frequency $f_1$. When the value of $R20_1$ is infinite, $A_{v1}$ is equal to unity.

When the switch 22 is in its second position, the gain $A_{v1}$ is one and the amplitude of the signal applied to the loudspeaker 14 at the frequency $f_1$ depends on the potential divider effect of the resistor 10 and the series combination of the resistor $20_1$ and the resonator $18_1$. The signal applied to the loudspeaker 14 at the frequency $f_1$ is attenuated by a factor $$(R20_1+Z_1)/(R10+R20_1+Z_1)$$

with respect to the signal at the output terminal of the amplifier 2. By appropriate selection of the values of the resistors $20i$ and the settings of the switches $22i$, a frequency response curve can be established such that at certain frequencies the overall gain of the propagation path, including the equalizer, is unity, at other frequencies it is greater than unity and at still other frequencies it is less than unity.

In a conventional equalizer, the positions of the switches and the values of the variable resistors are adjusted through slide controls on a user-accessible front panel of the equalizer. The settings allow the user of the equalizer to determine at a glance the configuration of the frequency response curve of the equalizer, and also allow the user to set the curve to a desired configuration, i.e., boosting certain frequencies and cutting other frequencies. This feature of the conventional equalizer is, however, subject to misuse, particularly when the soundfield requires the services of a skilled audio technician to achieve satisfactory equalization, since an unskilled person can adjust the settings of the slide controls as easily as can a skilled technician, with the result that the equalization achieved by the technician is lost and cannot be recreated without expenditure of substantial effort.

The National Semiconductor LMC835 integrated circuit is a programmable resistor network suitable for use in conjunction with an operational amplifier and a bank of fourteen resonators to provide an equalizer. As shown in FIG. 2, the LMC835 comprises multiple resistors 30 connected in series with respective switches 34. The resistors are arranged in groups of twelve, which are connected to the resonators 18 respectively. Only one of the groups of twelve resistors is shown in FIG. 2. Each group of twelve resistors is divided into a boost network 38 and a cut network 42. In the boost mode, all the switches connected to the resistors of the cut network 42 are non-conductive and therefore the cut network is out of circuit. One or more of the switches connected to the resistors of the boost network are conductive, and the resonator 18 is connected in series with the boost network (of which the resistance depends on which of the switches 34 are conductive) between the inverting terminal 17 of the amplifier 4 and ground. In the cut mode, all the switches connected to the resistors of the boost network 38 are non-conductive and one or more of the switches connected to the resistors of the cut network 42 are conductive.

The permitted states of the switches 34 allow twelve different boost settings, twelve different cut settings and a neutral, or unity gain setting. The states of the switches are controlled by serial data applied to the integrated circuit by way of a serial data port having data, clock and strobe lines, and a serial-to-parallel register 46. The serial data is applied to the register 46 in a succession of data sets, each of which comprises band selection data and gain selection data. The state of the data line is read on successive clock pulses, and a strobe pulse signifies the end of a data set. The strobe pulse causes the preceding data set to be latched. The band selection data is latched into a latch 48 and is decoded by a decoder 50 to select one of the fourteen banks of twelve resistors, and the gain selection data is latched into a latch 52 and is applied to a selector circuit 54. The circuit 54 responds to the gain selection data by causing selected switches 34 to be rendered conductive. Hitherto, it has been conventional to supply the serial data to the LMC835 integrated circuit by use of front panel controls on the equalizer. For example, as shown in FIG. 3, the equalizer might be provided with a cut switch 56 and a boost switch 58 for each group of resistors. On momentarily closing one of the switches of the pair, e.g., the cut switch 56, a microcomputer 60 generates a data set which is applied to the LMC835 circuit 64. The band selection data of the data set identifies the group of resistors of the circuit 64 that is associated with one of the resonators 18, and the gain selection data causes switches 34 of the circuit 64 to be closed such that the gain of the equalizer at the frequency associated with the selected group of resistors is reduced by one step.

A disadvantage of the LMC835 integrated circuit is that on loss of operating power for the equalizer, due to switching off of the equalizer or to interruption of the utility service supply, the gain settings are lost. In order to allow the frequency response curve to be recreated, an equalizer employing the LMC835 integrated circuit may include an LED bar graph display 62 which is driven by the signals provided by the microcomputer and provides a visible indication of the shape of the frequency response curve of the equalizer. After interruption of the power supply, the user of the equalizer can adjust the boost and cut switches to recreate the frequency response curve previously shown by the bar graph display, provided of course that the shape of the curve is known.

SUMMARY OF THE INVENTION

A preferred embodiment of the present invention in its first aspect comprises apparatus for equalizing a soundfield. The apparatus comprises an amplifier and a gain control circuit for selectively adjusting the gain of the amplifier as a function of frequency in response to data values received by the gain control circuit. The apparatus has power supply terminals for supplying operating current from an external power source to the amplifier and the gain control circuit. In addition, the apparatus comprises an electronic storage device for storing data values and applying those data values to the gain control circuit. The stored data values are maintained in the apparatus upon interruption of the supply of operating current to the power supply terminals. The apparatus has an input port for applying data values to the storage device, and does not have manually actuable controls for selectively adjusting the stored data values.

In accordance with a second aspect of the invention, a soundfield is equalized using apparatus which comprises a first component and a second component. The first component comprises an amplifier, a gain control circuit for selectively adjusting the gain of the amplifier as a function of frequency in response to data values received by the gain control circuit, a storage device for storing data values, and an input port for receiving an electrical signal which is coded in accordance with selected data values for applying the data values to the storage device. The second component comprises a device for generating an electrical signal which is coded in accordance with selected data values and an output port for making the electrical signal available at the exterior of the second component. The output port of the second component is connected to the input port of the first component and the second component is used to apply an electrical signal which is coded in accordance with selected data values to the input port of the first component, whereby the selected data values are stored in the storage device of the first component. The second component is thereafter disconnected from the first component.

Preferably, the storage device is a non-volatile random-access memory having several separately addressable memory locations in which different sets of data values can be stored. Any one of the sets of data values can be selected by the user by operating appropriate front panel controls.

BRIEF DESCRIPTION OF THE DRAWINGS

For a better understanding of the invention, and to show how the same may be carried into affect, reference will now be made, by way of example, to the accompanying drawings in which:

FIG. 1 is a block diagram of a conventional audio system including an equalizer, FIG. 4 is a partly schematic diagram of a first equalization system embodying the present invention.

The detailed description that follows is addressed to persons skilled in the art. Therefore, matters of routine circuit design, such as timing and interfacing requirements, and other matters that do not contribute to an understanding of the invention are not described.

DETAILED DESCRIPTION

Figure 2:
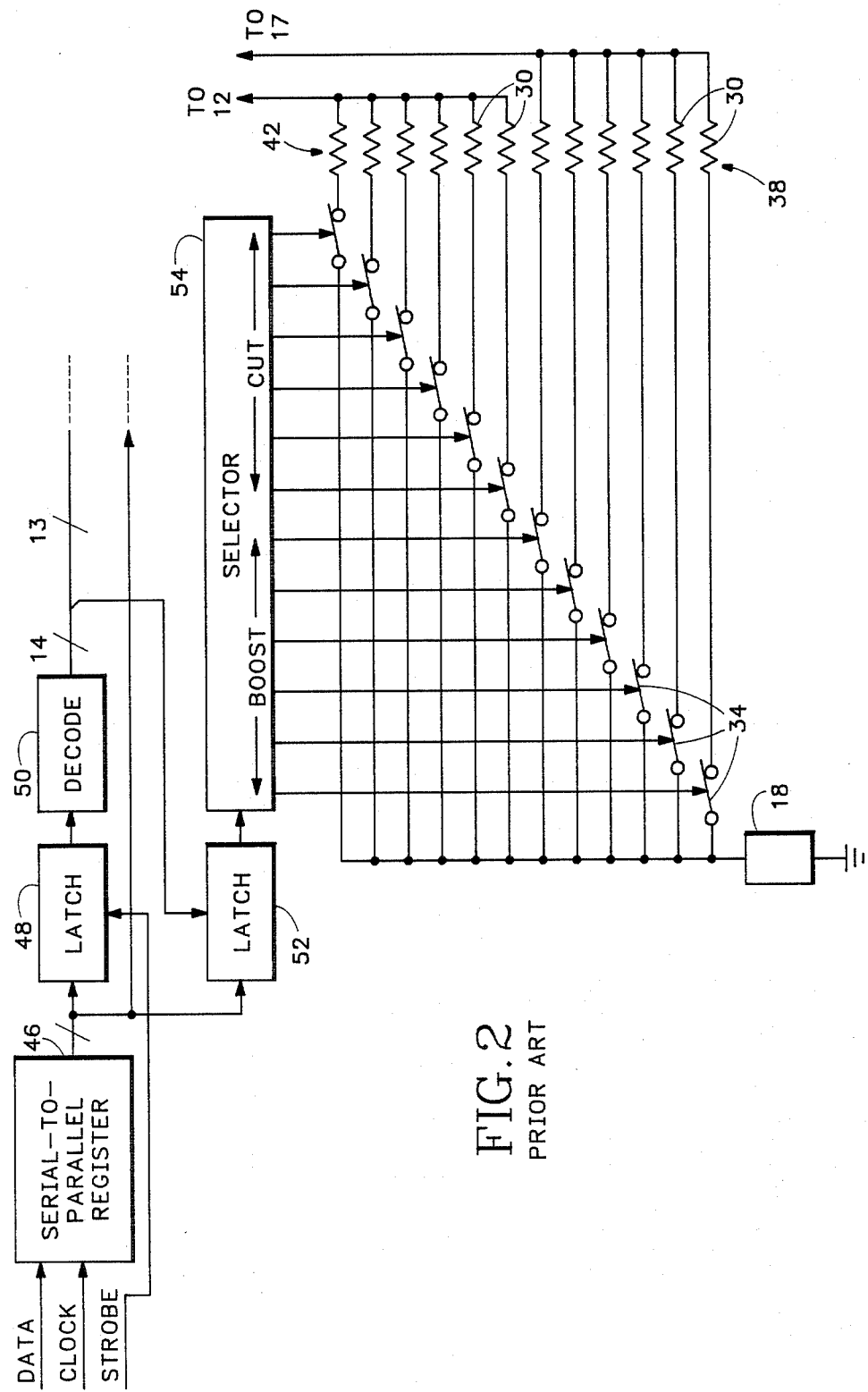
FIG. 2 is a partly schematic diagram of a portion of the National Semiconductor LMC835 integrated circuit.
Figure 3:
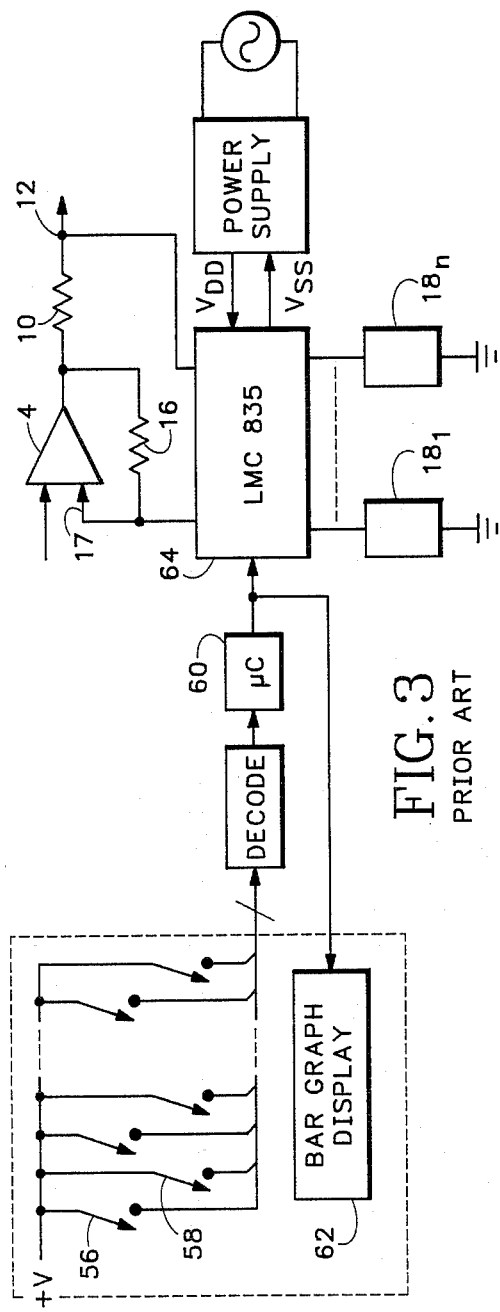
FIG. 3 is a block diagram of an equalizer incorporating the LMC835 integrated circuit.

The equalization system shown in FIG. 4 comprises a master equalizer 70 and a slave equalizer 74. The master equalizer is of the general form illustrated in FIG. 3, except that it has an output port 78 at which the serial data that is provided to the LMC835 circuit 64 is made available at the exterior of the equalizer.

The slave equalizer 74 does not have any front panel controls similar to the user interface of the master equalizer, but it has an input port 80 at which it receives the serial data provided at the output port 78 of the master equalizer 70. The serial data received by way of the input port 80 is applied to an LMC835 circuit 82. In carrying out an equalization, the master equalizer is out of the audio signal path and is used as a terminal for supplying the slave equalizer with serial data to establish the desired frequency response curve of the slave equalizer. Once equalization has been achieved, the master equalizer is disconnected from the slave equalizer, and accordingly the equalization curve cannot be adjusted manually unless access can be had to another terminal.

The slave equalizer includes a power supply circuit 86 which receives alternating current from the utility service supply and provides operating current to the various components of the master equalizer. In particular, the power supply circuit provides positive and negative DC voltages to the circuit 82 by way of the $V_{dd}$ and $V_{ss}$ pins of the circuit.

It will be understood that so long as the power supply circuit provides operating current to the circuit 82 of the slave equalizer, the serial data received from the master equalizer is stored in the latch circuits (not shown in FIG. 4) of the slave equalizer when the master equalizer is disconnected from the slave equalizer. In order to protect the slave equalizer against loss of this data in the event that there is an interruption in supply of operating current from the utility service supply to the slave equalizer, the slave equalizer includes an auxiliary battery-driven power supply circuit 88. A voltage sensitive switch 90 prevents discharge of the battery when the power supply circuit 86 provides operating current, but on interruption of the utility service supply the switch 90 immediately connects the auxiliary power supply circuit 88 to the circuit 82. The circuit 88 provides sufficient current to maintain the circuit 82 in operating condition, i.e., without loss of data stored in the latch and select circuits, when supply of current from the power supply circuit 86 is interrupted, so that when power is restored the frequency response curve of the slave equalizer will be the same as it was before loss of power.

Figure 5:
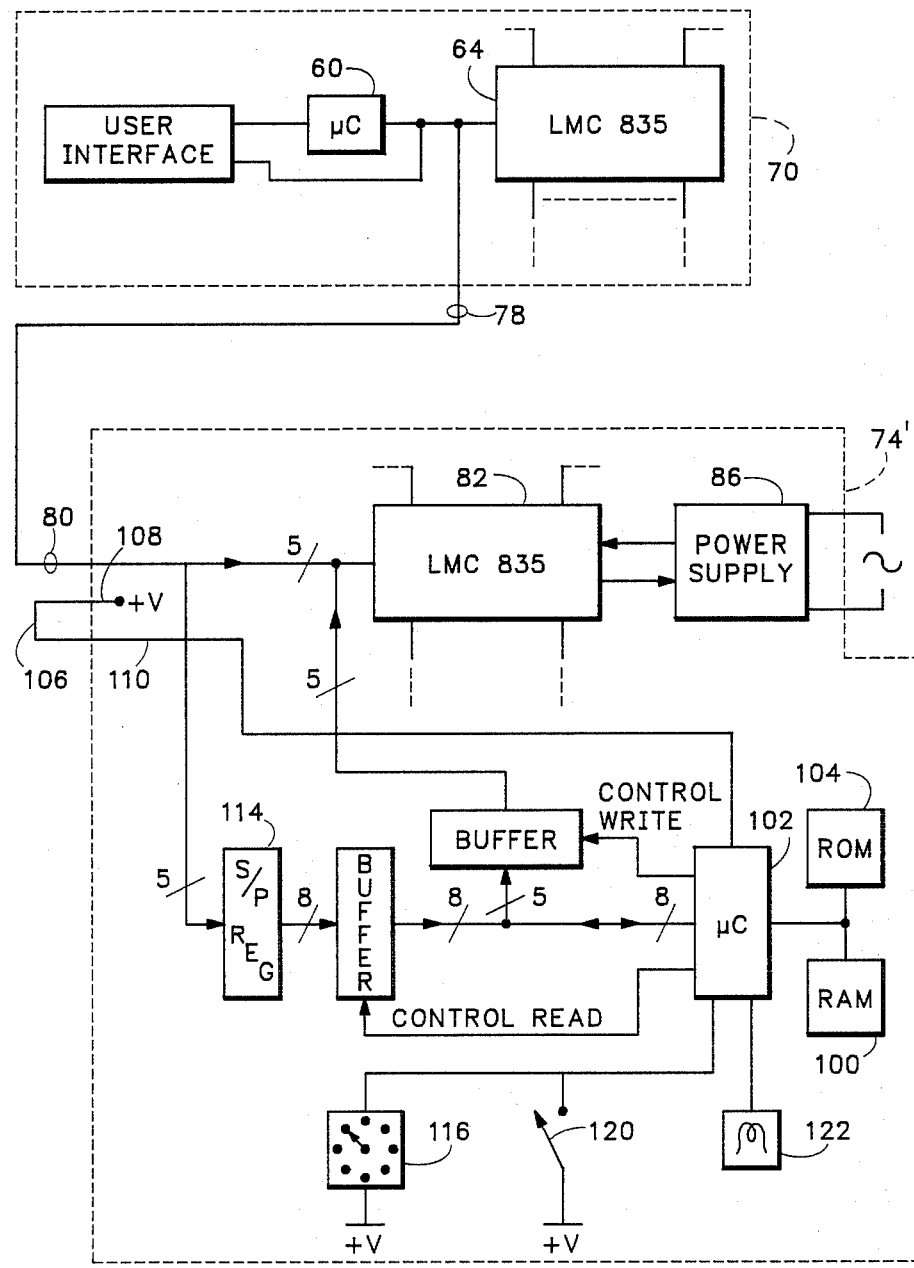
FIG. 5 is a partly schematic diagram of a second equalization system embodying the present invention.
Figure 6:
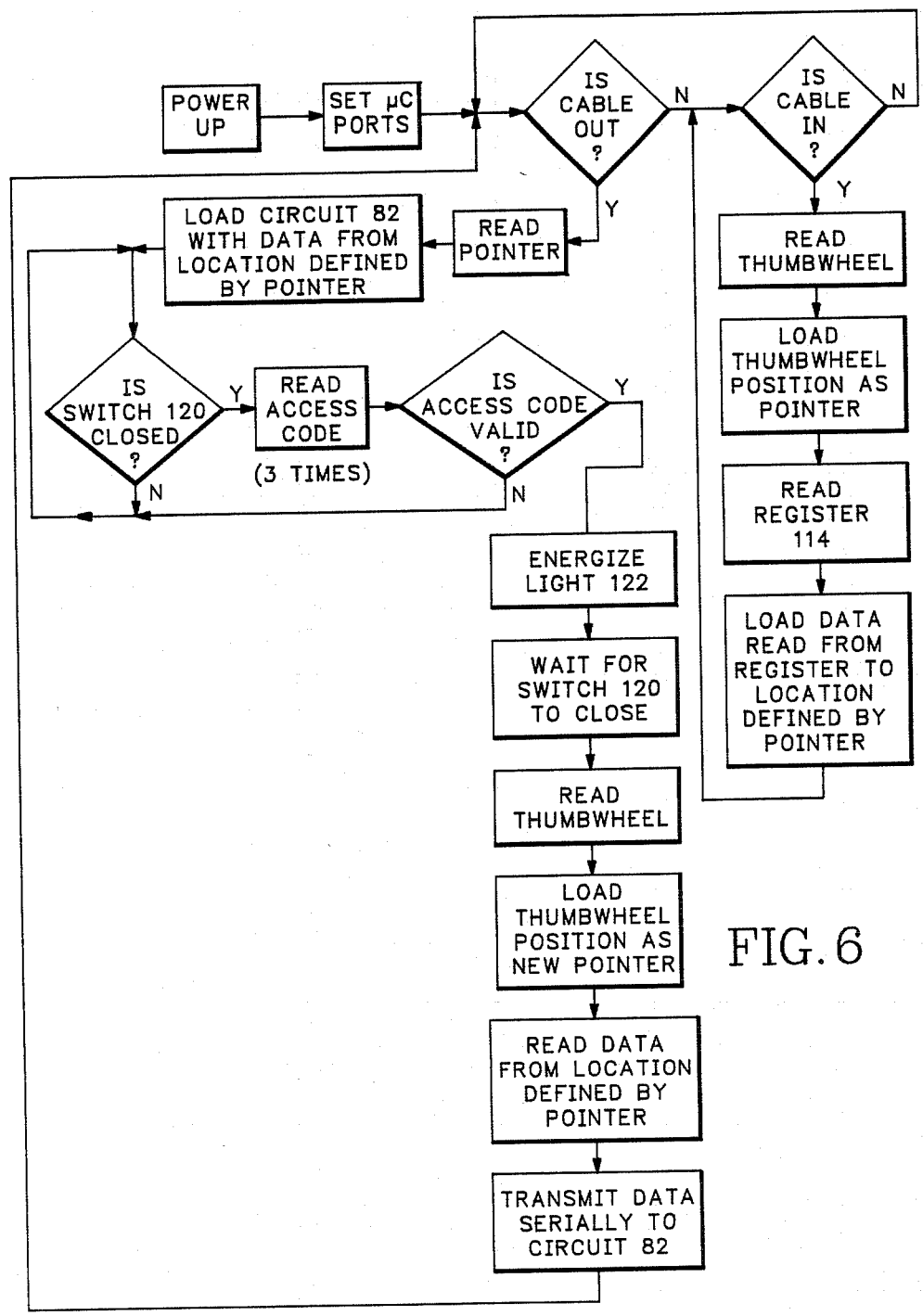
FIG. 6 is a flowchart illustrating the operation of the FIG. 5 equalizer.

The slave equalizer 74' shown in FIG. 5 is similar to the slave equalizer 74 shown in FIG. 4, except that it does not include an auxiliary power supply circuit for maintaining the circuit 90 in operating condition but instead includes a non-volatile random-access memory (RAM) 100 and a microcomputer 102 for controlling writing of data received at the input port 80 to the memory 100 and reading of data from the memory 100 to the latch and select circuits of the slave equalizer. The data written into the RAM, which may be a commercially available hybrid circuit including a lithium cell, is preserved upon loss of normal operating power for the equalizer. The microcomputer 102 operates under control of a program stored in a read-only memory (ROM) 104. The operations performed by the microcomputer are illustrated in the flowchart shown in FIG. 6.

The cable for connecting the output port 78 of the master equalizer to the input port 80 of the slave equalizer includes not only the conductors for supplying data, clock and strobe signals to the circuit 82 of the slave equalizer, but also a jumper 106 which is connected to additional pins of the plug used for connecting the cable to the input port. These additional pins mate with terminals 108 and 110 of the input port, and these terminals are accordingly shorted by the jumper 106. In normal operation, the microcomputer 102 repeatedly polls the state of the pin 110. If the pin 110 is at the potential of the pin 108, this implies that the master equalizer is connected to the slave equalizer and therefore that the user wishes to load data into the slave equalizer and have it stored in the memory 100. The microcomputer 60 of the master equalizer generates a data set which is provided to the slave equalizer by way of the input port 80. The data set is latched into the circuit 82, in the manner described previously, and is also loaded into a serial-to-parallel register 114. The strobe pulse provided by the microcomputer 60 for latching the set into the circuit 82 is treated as an interrupt by the microcomputer 102, and accordingly the microcomputer 102 enters an interrupt service routine. The microcomputer 102 services the interrupt by reading the data set stored in the register 114 and writing it into the memory 100. The sequence of latching the data sets into the circuit 82 and loading them into the RAM 100 is continued until all the data sets required to define a desired frequency response curve have been transferred from the master equalizer to the slave equalizer.

The memory 100 has eight storage locations each able to store all the data sets required to define a frequency response curve for the slave equalizer. The storage location into which the data sets defining a new frequency response curve are written is defined by a pointer provided by an eight-position thumbwheel switch 116, the position of which in the range from 1 to 8 is read by the microcomputer 102. The memory 100 also has a ninth storage location in which it stores the pointer currently provided by the thumbwheel switch. When the data sets defining a frequency response curve are written into one of the first eight storage locations, the data sets defining the curve (if any) that was previously stored at that location are erased from the memory.

When the data sets defining a new frequency response curve have been loaded into the memory 100, switch 116 is advanced to designate the next location into which the next series of data sets is to be written. When data sets defining all the desired frequency response curves have been applied to the port 80, the slave equalizer is disconnected from the master equalizer by removing the plug from the input port 80. Upon detecting that the pin 110 is no longer at the same potential as the pin 108, implying that the master equalizer is no longer connected to the slave equalizer, the microcomputer 102 enters a select routine.

In the select routine, the microcomputer 102 reads the pointer from the memory 100. After a short delay to ensure that the circuit 82 is functioning, the microcomputer 102 enters an old curve subroutine. In the old curve subroutine, the microcomputer 102 uses the pointer as an address for reading data sets from the memory and loading them into the circuit 82. In this manner, the data sets that were most recently received from the master equalizer are loaded into the circuit 82. These data sets are already present in the circuit 82 due to their having been loaded both into the circuit 52 and into the memory 100 and therefore the state of the circuit 82 is unchanged.

In the select routine, the microcomputer 102 also polls the state of the thumbwheel switch 116 and a two-position switch 120. If the switch 120 is closed, it implies that an attempt is being made to enter an access code which will enable the user to select a frequency response curve other than the one designated by the thumbwheel switch at the time of entering the select routine. If the switch 120 is found to be closed, the microcomputer does not read data sets from the memory but enters a new curve subroutine. In the new curve subroutine, the microcomputer first determines whether a valid access code has been entered. The access code is stored in the ROM 104. For example, the access code might be 123, and in order to enter this code the user turns the thumbwheel to position 1 and closes the switch 120, turns the thumb wheel to the position 2 and closes the switch 120 and turns the thumbwheel to the position 3 and closes the switch 120. On detecting that a valid access code has been entered, the microcomputer 102 causes a front panel light 122 to be energized. The user can then select one of the stored frequency response curves, for example the curve 4, by turning the thumbwheel to the position 4 and closing the switch 120. The pointer for position 4 of the thumbwheel switch is entered in the memory 100, and the microcomputer then reads the data defining frequency response curve 4 from the RAM 100 and applies this data to the circuit 82 by way of the buffer 84.

In the event that the microcomputer 102 enters the new curve subroutine but entry of a valid access code is not detected by the microcomputer, the microcomputer enters the old curve subroutine.

If there is an interruption in the utility service supply, the data sets stored in the latches of the circuit 82 are dissipated. However, the data sets defining the eight frequency response curves to have been loaded in the slave equalizer remain stored in the non-volatile memory 100, together with the pointer defining the location in the memory of the data sets that were most recently loaded into the circuit 82. On power up, i.e., when the microcomputer 102 receives operating current after having been deprived of operating current, the microcomputer polls the state of the pin 110 and if the pin 110 is not at the same potential as the pin 108 the microcomputer enters the select routine. Provided a valid access code is not entered, the result of entering the select routine is that the data sets that were most recently loaded into the circuit 82 are once again loaded into that circuit and the slave equalizer then operates with the same frequency response curve as it had prior to interruption of the utility service supply. If, on power up, the pin 110 is at the same potential as the pin 108 the microcomputer 102 waits to receive data sets by way of the input port 80.

It will be appreciated that the present invention is not restricted to the particular embodiments that have been described and illustrated, and that variations may be made therein without departing from the scope of the invention as defined in the appended claims and equivalents thereof. In particular, the invention is not restricted to use with the National Semiconductor LMC835 integrated circuit, and may be implemented using other programmable resistor networks. The invention is not restricted to use of a master equalizer, such as the equalizer 70 shown in the drawings, for loading data sets into the slave equalizer. For example, data sets may be created by a special-purpose programming tool or a general-purpose personal computer and entered in the slave equalizer by way of an RS 232 serial data port or a data port employing the MIDI protocol (a standard used for communication between electronic musical instruments). Although the LMC835 circuit has only fourteen groups of resistors, by use of multiple circuits more than fourteen frequency bands can be controlled. In a practical implementation of the invention, a dual channel (left and right stereo) slave equalizer which is capable of controlling 28 bands having their center frequencies at ⅓ octave centers has been constructed. In a simplified form of the slave equalizer 74', the memory 100 has only one storage location and therefore is only able to store data sets defining one frequency response curve. In this case, the microcomputer 102 automatically loads the data sets defining this frequency response curve into the circuit 82 when operating current is received and the cable is not connected to the input port 80.

We claim:

1. Apparatus for equalizing a soundfield, comprising:
an amplifier,
a gain control circuit for selectively adjusting the frequency response of the amplifier in response to data values received by the gain control circuit, said gain control circuit comprising a plurality of resonators connectd to the amplifier, and means for selectively adjusting the impedance of each resonator in response to said data values,
an input port for receiving data values,
an electronic storage device for storing data values received by way of the input port and applying those data values to the gain control circuit, and
power supply terminals for supplying operating current from an external power source to the electronic storage device,
the stored data values being maintained in the apparatus upon interruption of the supply of operating current to the power supply terminals, and the apparatus having no manually actuable controls for selectively adjusting the stored data values.

2. Apparatus to according to claim 1, wherein the electronic storage device comprises a latch and selector circuit and the stored data values are maintained in the storage device upon interruption of the supply of operating current to the power supply terminals by an auxiliary power supply included in the apparatus.

3. Apparatus according to claim 1, wherein the electronic storage device comprises a latch circuit and the stored data values are maintained in the apparatus upon interruption of the supply of operating current to the power supply terminals by a non-volatile memory which is independent of the latch circuit, and the apparatus further comprises means for loading the contents of the non-volatile memory into the latch circuit upon restoration of the supply of operating current to the power supply terminals.

4. Apparatus according to claim 3, wherein the non-volatile memory has a plurality of storage locations, each of which is capable of storing multiple data values, and the apparatus further comprises selector means for selecting one of the storage locations and loading the data values stored at that location into the latch circuit upon restoration of the supply of operating current to the power supply terminals.

5. Apparatus according to claim 4, wherein the non-volatile memory has at least one location for storing an access code and the selector means comprise switch means for entering a code and means for preventing selection of a storage location unless the code entered by way of the switch means matches an access code stored in the non-volatile memory.

6. Apparatus according to claim 1, wherein the electronic storage device comprises a latch circuit and the stored data values are maintained in the apparatus upon interruption of the supply of operating current to the power supply terminals by a non-volatile memory which is independent of the latch circuit, the non-volatile memory having a plurality of storage locations, each of which is capable of storing multiple data values, and the apparatus further comprises selector means for selecting one of the storage locations of the non-volatile memory and loading the contents of the selected storage location into the latch circuit upon restoration of the supply of operating current to the supply power terminals.

7. Apparatus according to claim 6, wherein the non-volatile memory has at least one location for storing an access code and the selector means comprise switch means for entering a code and means for preventing selection of a storage location unless the code entered by way of the switch means matches an access code stored in the non-volatile memory.

8. Apparatus according to claim 1, wherein the resonators each have first and second terminals, the first terminal of each resonator being connected to a reference potential level, and the apparatus further comprises switch means for connecting the second terminal of each resonator selectively to an input terminal of the amplifier or an output terminal of the apparatus.

9. Apparatus according to claim 1, wherein the amplifier has a non-inverting input terminal for receiving an audio frequency signal, an inverting input terminal, and an output terminal, the output terminal being connected to the inverting input terminal through a first resistor and being connected to an output terminal of the apparatus through a second resistor, and wherein each resonator has first and second terminals, th first terminal of each resonator being connected to a reference potential level, and the apparatus also comprises switch means for connecting the second terminal of each resonator selectively either to the non-inverting input terminal of the amplifier or to the output terminal of the apparatus.

10. A method of equalizing a soundfield employing a first component and a second component, the first component comprising an amplifier, a gain control circuit for selectively adjusting the frequency response of the amplifier in response to data values received by the gain control circuit, said gain control circuit comprising a plurality of resonators connected to the amplifier, and means for selectively adjusting the impedance of each resonator in response to said data values, and the first component also comprising an input port for receiving an electrical signal, which is coded in accordance with selected data values, and a storage device for storing data values received by way of the input port, said first component having no manually actuable controls for receiving and selectively adjusting the stored said data values, and the second component comprising a device for generating said electrical signal which is coded in accordance with selected data values and an output port for making said electrical signal available at the exterior of the second component, the method comprising connecting the output port of the second component to the input port of the first component, using the second component to supply said electrical signal which is coded in accordance with selected data values to the input port of the first component, whereby the selected data values are stored in the storage device of the first component, and thereafter disconneoting the second component from the first component.

11. A method according to claim 5, wherein the first component comprises power supply terminals for supplying operating current from an external power source to the storage device, and the first component also comprises a non-volatile memory device, and the method comprises loading the selected data values into both the storage device and the non-volatile memory device and, in the event that supply of operating current to the power supply terminals is interrupted and subsequently restored, accessing the data values stored in the memory device and loading them from the memory device into the storage device.

12. A method according to claim 11, wherein the non-volatile memory device has a plurality of storage locations, each of which is capable of storing multiple data values, and the method comprises selecting one of the storage locations, accessing the data values stored in the memory device at that location, and loading the data values from the selected location into the storage device.

13. Apparatus for equalizing a soundfield comprising, in combination, a first component and a second component, the first component comprising:
  an amplifier,
  a gain control circuit for selectively adjusting the frequency response of the amplifier in response to data values received by the gain control circuit, said gain control circuit comprising a plurality of resonators connected to the amplifier, and means for selectively adjusting the impedance of each resonator in response to said data values,
  an input port for receiving an electrical signal which is coded in accordance with selected data values for applying the data values to a storage device, and
  an electronic storage device for storing data values received by way of said input port, said first component having no manually actuable controls for receiving and selectively adjusting the stored data values, and the second component comrising:
  a device for generating an electrical signal which is coded in accordance with selected data values, and
  an output port for making the electrical signal available at the exterior of the second component, the output port of the second component being connectable to the input port of the first component, whereby the second component may be used to supply an electrical signal which is coded in accordance with selected data values to the input port of the first component for storage of the selected data values in the storage device of the first component, the selected data values remaining stored in the storage device when the output port of the second component is disconnected from the input port of the first component.

14. Apparatus according to claim 13, wherein the electronic storage device comprises a latch circuit having power supply terminals and the stored data values are maintained in the apparatus upon interruption of the supply of operating current to said power supply terminals by a non-volatile memory which is independent of the latch circuit, the non-volatile memory having a plurality of storage locations, each of which is capable of storing multiple data values, and the apparatus further comprises selector means for selecting one of the storage locations and loading the data values stored at that location into the latch circuit upon restoration of the supply of operating current to said power supply terminals.

15. Apparatus according to claim 14, wherein the non-volatile memory has at least one location for storing an access code and the selector means comprise switch means for entering a code and means for preventing selection of a storage location unless the code entered by way of the switch means matches an access code stored in the non-volatile memory.

16. Audio apparatus comprising:
  a source of an electrical signal having audio frequency components,
  equalization apparatus comprising, in combination, a first component and a second component, the first component comprising:
    an amplifier connected to receive the electrical signal porvided by said source and to provide an electrical output signal,
    a gain control circuit for selectively adjusting the frequency response of the amplifier in response to data values received by the gain control circuit, said gain control circuit comprising a plurality of resonators connected to the amplifier, and means for selectively adjusting the impedance of each resonator in response to said data values,
    an input port for receiving an electrical signal which is coded in accordance with selected data values, and
    an electronic storage device for receiving and storing said data values received by way of the input port,
  and the second component comprising:
    a device for generating said electrical signal which is coded in accordance with selected data values, and
    an output port for making said electrical signal available at the exterior of the second component, the output port of the second component being connectable to the input port of the first component, whereby the second component may be used to supply said electrical signal which is coded in accordance with selected data values to the input port of the first component for storage of the selected data values in the storage device of the first component, the selected data values remaining stored in the storage device when the output port of the second component is disconnected from the input port of the first component, and
  an electroacoustic transducer connected to receive said electrical output signal provided by the amplifier and generate an acoustic signal therefrom.

17. Apparatus according to claim 16, wherein the electronic storage device comprises a latch circuit having power supply terminals and the stored data values are maintained in the apparatus upon interruption of the supply of operating current to said power supply terminals by a non-volatile memory which is independent of the latch circuit, the non-volatile memory having a plurality of storage locations, each of which is capable of storing multiple data values, and the apparatus further comprises selector means for selecting one of the storage locations and loading the data values stored at that location into the latch circuit upon restoration of the supply of operating current to said power supply terminals.

18. Apparatus according to claim 17, wherein the non-volatile memory has at least one location for storing an access code and the selector means comprise switch means for entering a code and means for preventing selection of a storage location unless the code entered by way of the switch means matches an access code stored in the non-volatile memory.

* * * * *